(12) United States Patent
Chang et al.

(10) Patent No.: US 8,733,271 B2
(45) Date of Patent: May 27, 2014

(54) METHOD AND APPARATUS FOR CONTINUOUS COATING

(71) Applicant: Institute of Nuclear Energy Research, Atomic Energy Council, Executive Yuan, R.O.C., Taoyuan County (TW)

(72) Inventors: Hwei-Liang Chang, Taoyuan County (TW); Zone-Sure Chang, Taipei (TW)

(73) Assignee: Institute of Nuclear Energy Research, Atomic Energy Council, Lungtan, Taoyuan (TW)

( * ) Notice: Subject to any disclaimer, the term of this patent is extended or adjusted under 35 U.S.C. 154(b) by 0 days.

(21) Appl. No.: 13/791,126

(22) Filed: Mar. 8, 2013

(65) Prior Publication Data

US 2013/0186328 A1    Jul. 25, 2013

Related U.S. Application Data

(62) Division of application No. 12/637,415, filed on Dec. 14, 2009, now Pat. No. 8,414,975.

(30) Foreign Application Priority Data

Aug. 23, 2012  (TW) .............................. 101130727 A (51) Int. Cl.
| | |
|---|---|
| *B05C 1/10* | (2006.01) |
| *B05C 1/12* | (2006.01) |
| *B05C 1/08* | (2006.01) |
| *B05C 11/10* | (2006.01) |
| *B29C 47/02* | (2006.01) |
| *B29C 47/12* | (2006.01) |
| *B29C 47/00* | (2006.01) |

(52) U.S. Cl.
CPC ... *B05C 1/10* (2013.01); *B05C 1/12* (2013.01); *B05C 1/0804* (2013.01); *B05C 11/1042* (2013.01); *B29C 47/025* (2013.01); *B29C 47/122* (2013.01); *B29C 47/0021* (2013.01)
USPC .......... 118/256; 118/259; 118/263; 118/416; 118/419; 118/429; 425/113; 425/380

(58) Field of Classification Search
CPC ........ B05C 11/1042; B05C 1/06; B05C 1/08; B05C 1/10; B05C 1/0813; B05C 5/0245; B05D 1/265; B05D 1/36; B05D 2203/30; B05D 2203/35
USPC ......... 118/256, 259, 260, 263, 266, 268, 313, 118/314, 320, 416, 419, 429; 425/113, 380; 366/77, 79–90
See application file for complete search history.

(56) References Cited

U.S. PATENT DOCUMENTS

| | | | | |
|---|---|---|---|---|
| 3,408,984 | A * | 11/1968 | Pullins ........................... | 118/259 |
| 4,850,833 | A * | 7/1989 | Pinto et al. ......................... | 425/6 |
| 5,441,687 | A * | 8/1995 | Murasaki et al. ............. | 264/167 |
| 2003/0085487 | A1 * | 5/2003 | Tanner et al. ............... | 264/176.1 |
| 2004/0168629 | A1 * | 9/2004 | Miskech et al. ............... | 118/109 |
| 2007/0243409 | A1 * | 10/2007 | Terao et al. .................... | 428/689 |
| 2008/0019137 | A1 * | 1/2008 | Takai et al. .................... | 362/311 |

* cited by examiner

*Primary Examiner* — Laura Edwards
(74) *Attorney, Agent, or Firm* — Jackson IPG PLLC (57) ABSTRACT

Disclosed is a method and apparatus for continuous coating with a rotational die in which coating materials flow in a radial direction. The linear speed of a substrate in need of coating is identical to the tangential speed of the surface of the rotational die so that the coating material, which flows in a radial direction of the rotational die, flows onto the substrate perpendicularly. Therefore, the ingredients of coating materials overlap one another (or stand vertically as a layer), and the vertical sequence of the coating material is ensured. This method and apparatus can be used to make organic electronic devices, organic light-emitting diodes and organic photovoltaic devices. Particularly, this method and apparatus can be used in bulk-hetero-junction of mixed coating of P-type and N-type semiconductors.

10 Claims, 7 Drawing Sheets

METHOD AND APPARATUS FOR CONTINUOUS COATING

This application is a Divisional Application of U.S. application Ser. No. 12/637,415, filed on Dec. 14, 2009, which issued as U.S. Pat. No. 8,414,975.

FIELD OF THE INVENTION

The present invention relates to a method and apparatus for continuous coating with a rotational die and, more particularly, to a method and apparatus for continuously, perpendicularly providing coating materials onto a substrate in need of coating so that the coating materials are in order vertically.

DESCRIPTION OF THE RELATED ARTS

There are conventional methods for coating such as brush painting, spray coating, screen-blade printing, screen-roll printing, ink-jet printing, roll coating, doctor-blade coating, dip coating, spin coating and slot die coating. A common objective of the conventional methods is uniformity of coating. The directional property of coating materials is seldom addressed. Almost nothing has been discussed about the vertical sequence of the coating materials on a substrate in need of coating. In making a layer (or multiple layers) of an organic electronic device with P-N junctions and, more particularly, in providing a layer (or layers) of bulk-hetero junctions of mixed coating of P-type and N-type organic semiconductors for solar cell, the mixed P-type and N-type organic semiconductor coating elements are better provided in order vertically (i.e. perpendicular to the flat-substrate of being coated) for preventing loss, while transmitting electrons and holes, due to un-effective inner recycling of P-N junctions. The conventional methods however cannot satisfy this need.

The direction of movement of a brush is parallel to the direction of coating in the brush painting. The direction of movement of a blade is parallel to the direction of coating in the screen-blade method or blade method. The direction of spin of drops of coating materials is parallel to the direction of coating in the spin coating. The direction of movement of a slot die is parallel to the direction of coating in the slot-die coating. Therefore, the coating materials are provided in parallel to the direction of relative movement.

In the ink-jet printing, droplets reach the substrate perpendicularly. The droplets however tend to form spheres because of cohesion. The droplets splash and spread horizontally on the substrate because they reach the substrate at high speed. The spray coating shares the same problems with the ink-jet printing.

In the roll coating and the screen-roll printing, the coating materials are provided onto a roll from a barrel in all directions. Therefore, the coating materials are not provided onto the substrate perpendicularly.

The present invention is therefore intended to obviate or at least alleviate the problems encountered in prior art.

SUMMARY OF THE INVENTION

It is the primary objective of the present invention to provide a method for coating materials, one at a time, onto a substrate perpendicularly so that the coating materials are in order vertically.

To achieve the foregoing objective, the method includes the step of providing an input device for transmitting at least one ingredient of each of the coating materials into the shell. There is provided a rotational die for receiving each of the coating materials from the input device. Each of the coating materials travels in a radial direction in the rotational die. The rotational die is driven so that the tangential speed on the periphery of the rotational die is identical to the linear speed of the substrate, thus providing each of the coating materials onto the substrate perpendicularly. An area of the substrate for receiving each of the coating materials from the rotational die is 1% to 99% of the entire area of the periphery of the rotational die.

Other objectives, advantages and features of the present invention will become apparent from the following description referring to the attached drawings.

BRIEF DESCRIPTIONS OF THE DRAWINGS

The present invention will be described via detailed illustration of the preferred embodiment referring to the drawings.

DESCRIPTION OF THE PREFERRED EMBODIMENT

Figure 6:
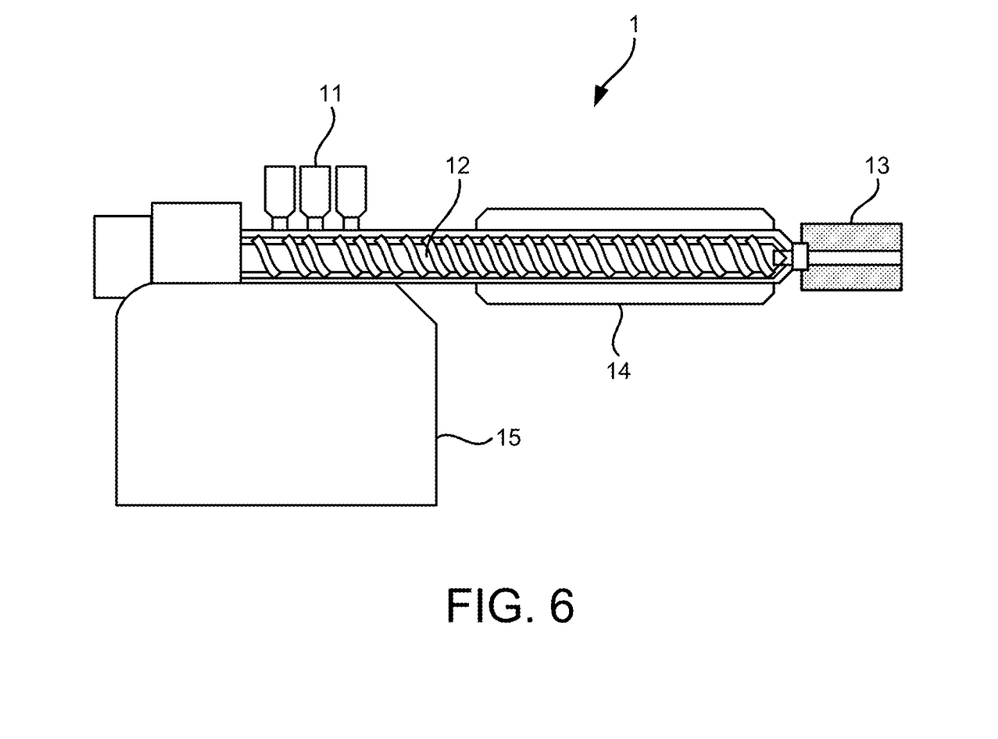
FIG. 6 is cross-sectional view of the coating apparatus of FIG. 1.
Figure 7:
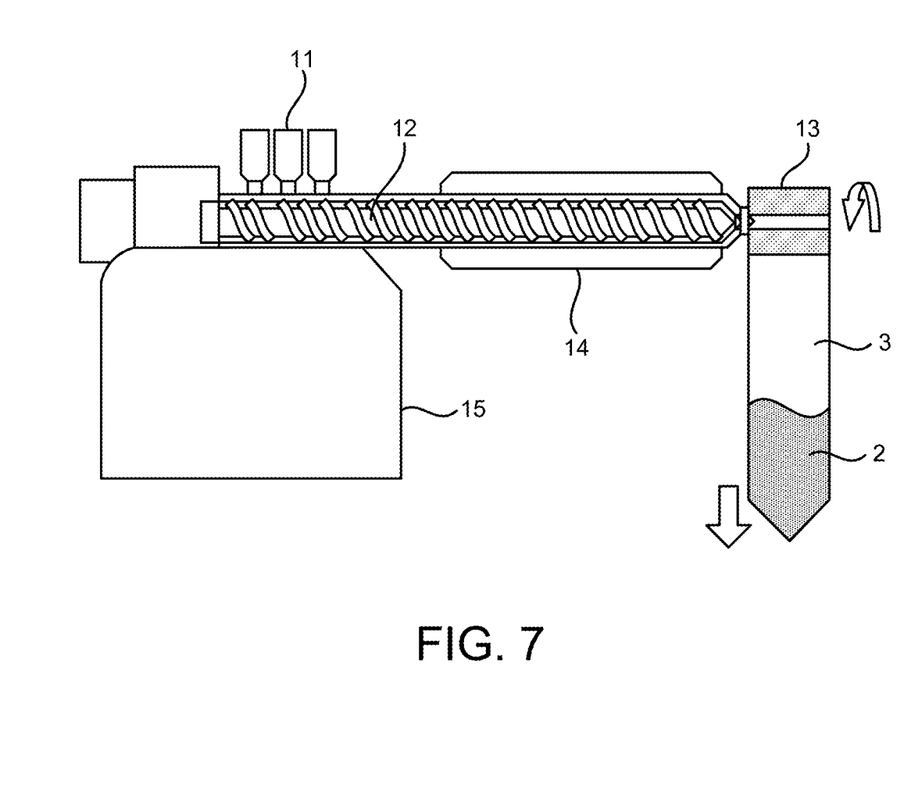
FIG. 7 is a cross-sectional view of a substrate in need of coating with the coating apparatus shown in FIG. 6.

Referring to FIGS. 6 and 7, there is shown an apparatus 1 for coating a substrate 3 according to the preferred embodiment of the present invention. The coating apparatus 1 includes an input device 11, an extrusion device 12, a rotational die assembly 13, a temperature control device 14 and a supportive device 15.

Figure 4:
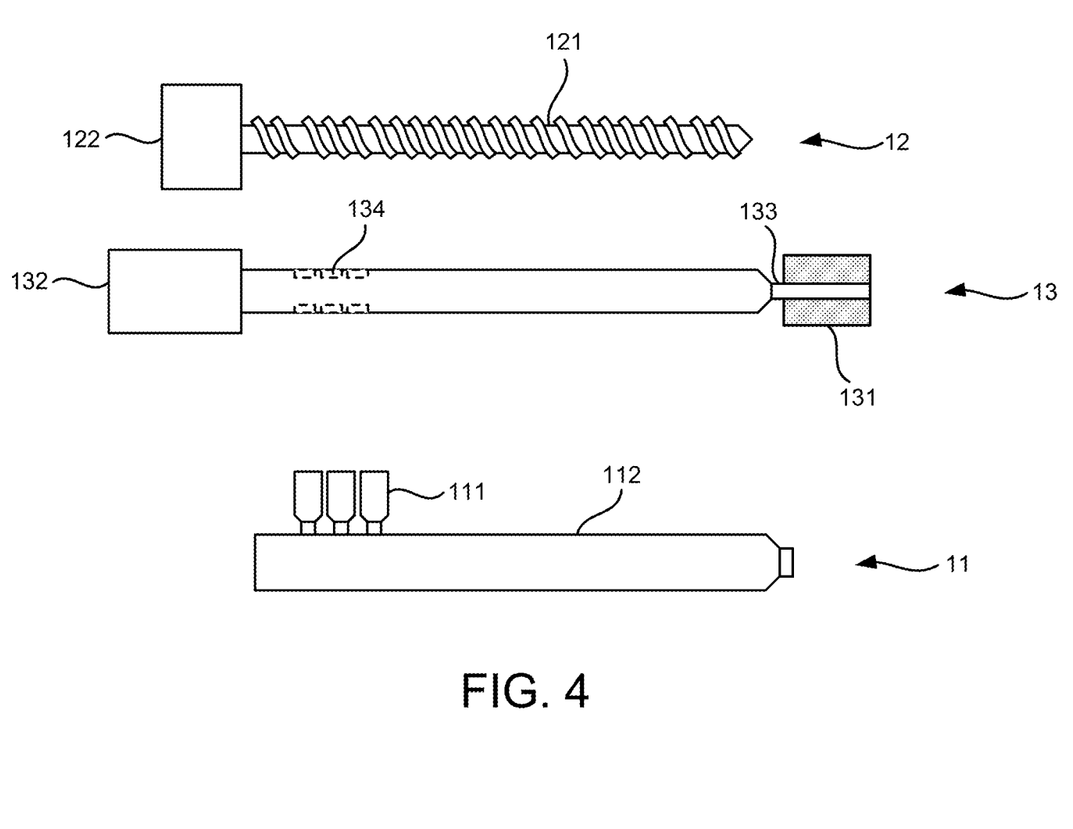
FIG. 4 is an exploded, partial view of the coating apparatus shown in FIG. 1.
Figure 5:
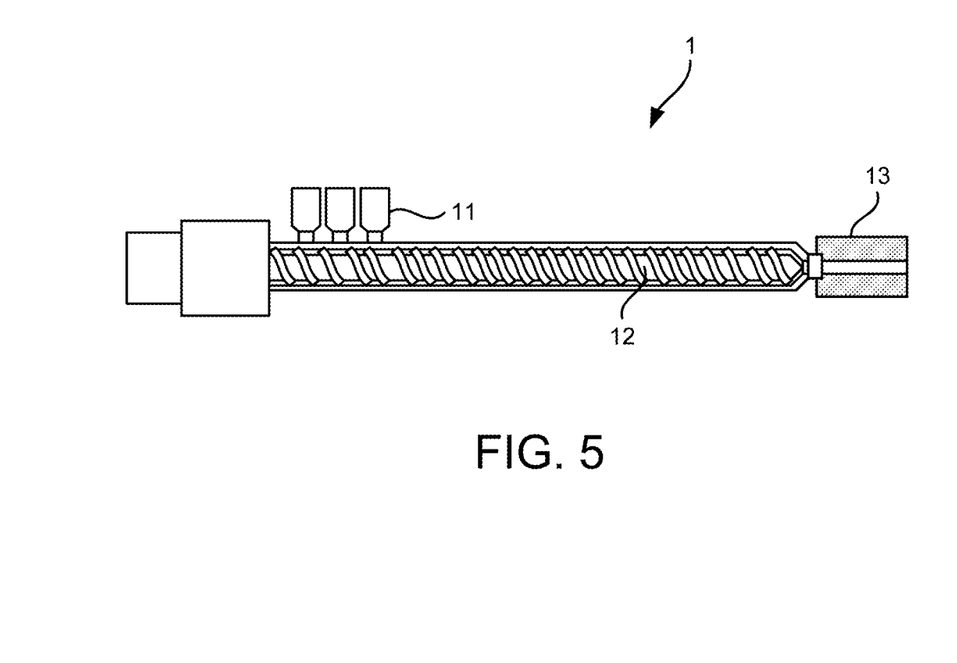
FIG. 5 is a cross-sectional, partial view of the coating apparatus shown in FIG. 4.

Referring to FIGS. 4 and 5, the input device 11 includes a shell 112 and at least one barrel 111 in communication with shell 112. There are three barrels 111 for examples. Each of the barrels 11 is used to contain an ingredient of a coating material. Each of the ingredients is fed into the shell 112 from a related one of the barrels 111.

The rotational die assembly 13 includes a rotational die 131, a tube 133 in communication with the rotational die 131 and a motor 132 connected to the tube 133 so that the motor 132 drives the rotational die 131 through the tube 133. The tube 133 is inserted in the shell 112. The tube 133 includes apertures 134 defined therein. The materials are fed into the tube 133 from the shell 112 through the apertures 134. The diameter and number of the apertures are determined based on the rate of the feed of the ingredients of the coating material. The internal diameter of the tube 133 may be constant or changing throughout the length of the tube 133.

Figure 1:
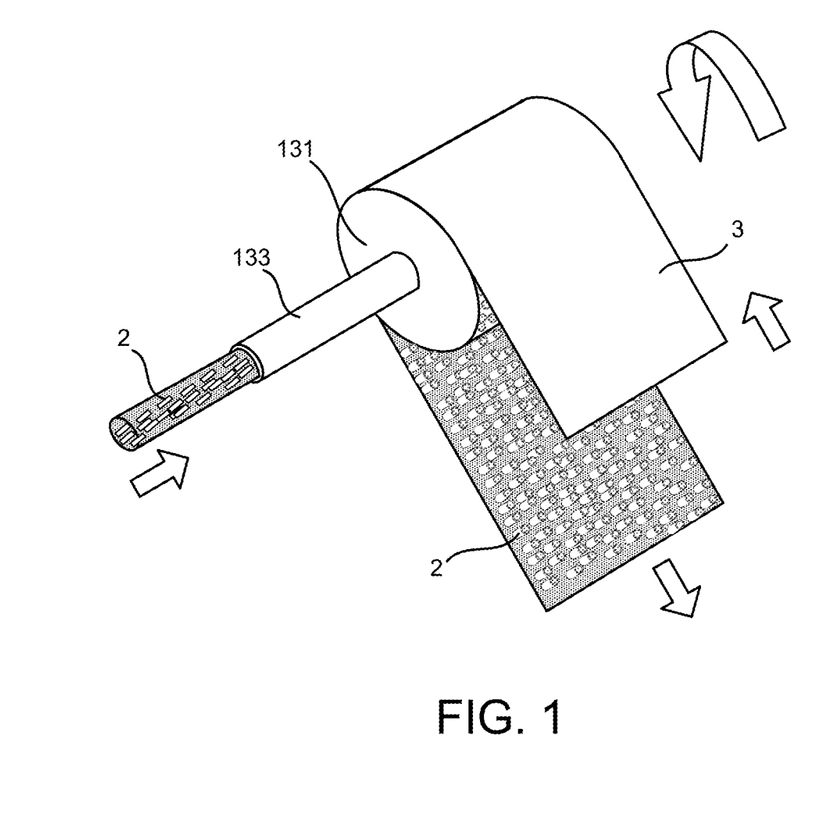
FIG. 1 is a perspective, partial view of a coating apparatus according to the preferred embodiment of the present invention.
Figure 2:
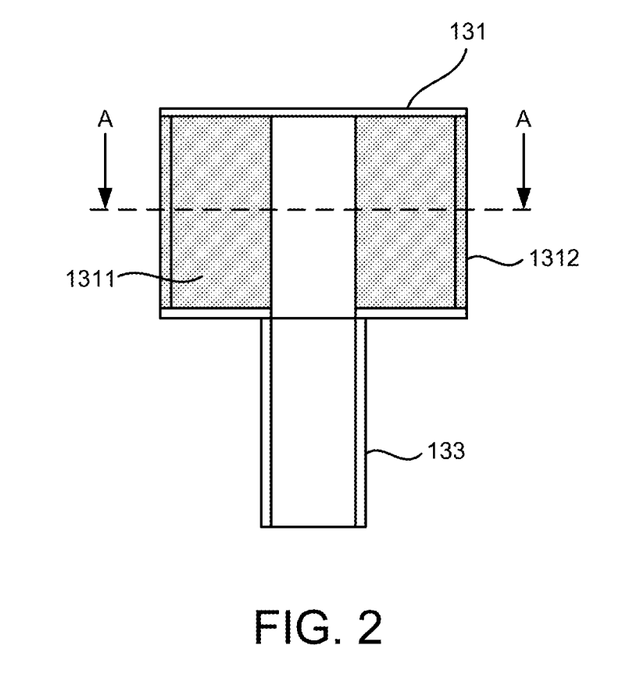
FIG. 2 is a cross-sectional, partial view of the coating apparatus shown in FIG. 1.
Figure 3:
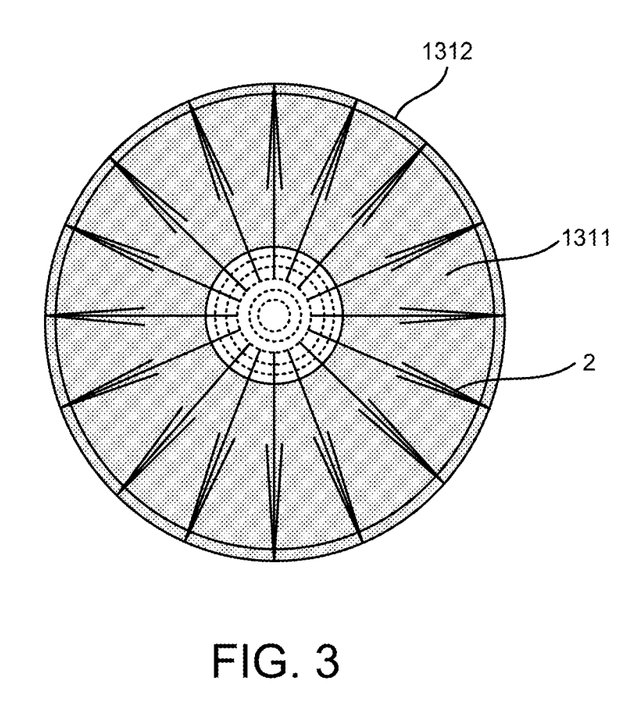
FIG. 3 is a cross-sectional, partial view of the coating apparatus shown in FIG. 2.

Referring to FIGS. 2 and 3, the rotational die 131 includes a core 1311 and a peripheral layer 1312 provided around the core 1311. The core 1311 is made of a porous material, a solid material in which tunnels are made, a sintering metal, a sintered ceramic material, sintered glass, a woven material, a non-woven material or any combination of the above-mentioned materials. The micro-structure of the core 1311 must be uniform so that the coating material leaves the periphery of the rotational die 131 evenly and vertically.

The peripheral layer 1312 may be made of a material identical to or different from that of the core 1311. Where the peripheral layer 1312 and the core 1311 are made of different materials, they are made separately and then connected to each other. Where the peripheral layer 1312 and the core 1311 are made of one same material identical, they are preferably made in one piece. The peripheral layer 1312 may be formed with a pattern for dividing the coating material into various regions on the substrate 3.

The extrusion device 12 includes a screw 121 and a motor 122 operatively connected to the screw 121 so that the motor 122 rotates the screw 121. The screw 121 is inserted in the cylinder 112. The screw 121 mixes and transmits the gradients of the coating material. The diameter and pitch of the screw 121 may be constant or changing throughout the length of the screw 121. There is only one screw 121 in the preferred embodiment. However, there may be two screws arranged in a series or one in another in another embodiment. The screw 121 may be replaced with a positive pushing device used to make polymers in another embodiment.

The screw 121 and an internal side of the tube 133 are considered together in order to provide desired mixing and transmitting. For example, a thread may be formed on the internal side of the tube 133 to provide excellent mixing.

Referring to FIG. 7, the substrate 3 is provided around the rotational die 1311. The substrate 3 can be reeled and expanded. A spacer may be used to keep the substrate 3 from the peripheral layer 1311 by a gap. However, a force may be used to bring the substrate 3 into contact with the peripheral layer 1311 if so desired. An area of the substrate 3 for receiving each of the coating materials from the peripheral layer 1311 is 1% to 99% of the entire area of the peripheral layer 1311. The ratio is preferably 5% to 99%. More preferably, the ratio is 10% to 99%. More preferably, the ratio is 40% to 99%. More preferably, the ratio is 50% to 99%. This ratio can be adjusted by providing two rollers to push the substrate 3 onto the spacer or peripheral layer 1311.

Each of the coating materials travels in a radial direction in the rotational die 131 because of the screw 121. The travel of each of the coating materials may alternatively be caused by a positive pushing force or pressure in the tube 133 or vacuum around the rotational die 131.

The motor 132 rotates the rotational die 131 via the tube 133 so that the tangential speed of any point of the peripheral layer 1311 is identical to the linear speed of the substrate 3 so that each of the coating materials perpendicularly reaches the substrate 3 from the peripheral layer 1311. Each of the coating materials may be left on the substrate 3 because of adhesion. Alternatively, a force may be used to leave each of the coating materials on the substrate 3. The force is exerted with a blade or a current of fluid. The fluid may be gas form or liquid. The gas may be air, nitrogen, inert gas, solution and organic dissolvent.

The substrate 3 is moved past the rotational die 131 several so that all of the coating materials are provided onto the substrate 3 from the rotational die 131, one over another. Thus, the coating materials are in order vertically.

The method can advantageously be used to make an electronic device selected such as an organic electronic device, an organic light-emitting diode and an organic photovoltaic device. The method can be used to provide organic polymer onto the substrate 3. The organic polymer may be directional liquid crystal. The method can advantageously be used for bulk-hetero junction in mixed coating of P-type and N-type organic semiconductors.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

What is claimed is:

1. An apparatus for providing coating materials, one at a time, onto a substrate perpendicularly so that coating materials are in order vertically, the apparatus comprising:
    an input device comprising a shell and at least one barrel in communication with the shell so that the barrel provides an ingredient of each of the coating materials into the shell;
    a rotational die assembly comprising:
        a tube inserted in the shell and made with apertures so that the gradient of each of the coating materials travels into the tube from the shell through the apertures;
        a rotational die in communication with the tube so that each of the coating materials travels into the die from the tube, wherein each of the coating materials travels in a radial direction in the rotational die; and
    a die-driving motor operatively connected to the tube so that the motor drives the rotational die via the tube, wherein a tangential speed on the periphery of the rotational die is identical to a linear speed of the substrate so that each of the coating materials is perpendicularly provided onto the substrate; and
    an extrusion device comprising at least one screw for mixing and transmitting each of the coating materials in the tube and a screw-driving motor for driving the screw;
    wherein an area of the substrate for receiving each of the coating materials from the rotational die is 1% to 99% of the entire area of the periphery of the rotational die.

2. The apparatus according to claim 1, wherein the rotational die comprises a peripheral layer made of at least one material selected from a group consisting of a porous material, a woven material, a non-woven material, a sintered metal, a sintered ceramic material and sintered glass.

3. The apparatus according to claim 2, wherein the rotational die comprises a pattern formed thereon for dividing each of the coating materials into various regions on the substrate.

4. The apparatus according to claim 1, wherein the rotational die comprises a core made of at least one material selected from a group consisting of a porous material, a woven material, a non-woven material, a sintered metal, a sintered ceramic material and sintered glass.

5. The apparatus according to claim 1, wherein the tube comprises changing internal diameter.

6. The apparatus according to claim 1, wherein the tube comprises a thread formed on an internal side thereof.

7. The apparatus according to claim 1, wherein a gap between the rotational die and the substrate is determined by a spacer.

8. The apparatus according to claim 1, wherein the rotational die is in contact with the substrate.

9. The apparatus according to claim 1, wherein the rotational die is configured to roll and expand the substrate.

10. The apparatus according to claim 1 comprising a temperature control device near the shell and a supportive device for supporting the input device, the extrusion device, the rotational die assembly, and the temperature control device.

\* \* \* \* \*